United States Patent
Ozard

(10) Patent No.: US 9,071,211 B1
(45) Date of Patent: Jun. 30, 2015

(54) COMPACT DOHERTY COMBINER

(71) Applicant: Kenneth Sean Ozard, Middlesex, NJ (US)

(72) Inventor: Kenneth Sean Ozard, Middlesex, NJ (US)

(73) Assignee: Anadigics, Inc., Warren, NJ (US)

( * ) Notice: Subject to any disclaimer, the term of this patent is extended or adjusted under 35 U.S.C. 154(b) by 211 days.

(21) Appl. No.: 13/713,409

(22) Filed: Dec. 13, 2012

Related U.S. Application Data

(60) Provisional application No. 61/576,232, filed on Dec. 15, 2011.

(51) Int. Cl.
*H03H 7/38* (2006.01)
*H03F 1/56* (2006.01)

(52) U.S. Cl.
CPC ..................... *H03F 1/565* (2013.01)

(58) Field of Classification Search
CPC ......... H03F 1/0288; H03F 3/602; H03F 3/24; H03F 2200/387; H03F 1/56; H03F 1/565
USPC ............................................. 330/124 R, 295
See application file for complete search history.

(56) References Cited

U.S. PATENT DOCUMENTS

| | | | | |
|---|---|---|---|---|
| 4,954,791 A | * | 9/1990 | Koenig | 332/164 |
| 5,420,748 A | * | 5/1995 | Ryu | 361/537 |
| 6,249,203 B1 | * | 6/2001 | Hanato et al. | 336/185 |
| 7,061,314 B2 | * | 6/2006 | Kwon et al. | 330/124 R |
| 7,193,473 B2 | * | 3/2007 | Pengelly et al. | 330/295 |
| 2011/0169590 A1 | * | 7/2011 | Namerikawa et al. | 333/136 |

FOREIGN PATENT DOCUMENTS

JP        2008159858 A    *    7/2008

* cited by examiner

*Primary Examiner* — Robert Pascal
*Assistant Examiner* — Kimberly Glenn
(74) *Attorney, Agent, or Firm* — Ward & Zinna, LLC

(57) ABSTRACT

A combiner coupled to output terminals of a Doherty amplifier, the combiner comprising an inverter circuit and a transformer circuit. The inverter circuit comprising at least a first network and a second network, wherein each of the first network and the second network includes lumped elements. The transformer circuit comprising at least a third network and a fourth network, wherein each of the first third and the fourth network includes the lumped elements, wherein the lumped elements are selected from the group of capacitors and inductors.

17 Claims, 2 Drawing Sheets

COMPACT DOHERTY COMBINER

CROSS REFERENCE TO RELATED APPLICATION

This application claims priority from the U.S. provisional application No. 61/576,232, titled "Compact Doherty Combiner", filed on Dec. 15, 2011, the disclosure of which is hereby incorporated by reference.

TECHNICAL FIELD

The present disclosure relates to a Doherty amplifier. More particularly, the present disclosure relates to a combiner for the Doherty amplifier.

BACKGROUND OF THE INVENTION

Currently, mobile communication systems require broad bandwidth and high linearity. Modern communications signals exhibit a high peak-to-average power ratio; therefore, an RF power amplifier is operated at a large power back-off to satisfy the high peak-to-average power ratio. Back-off corresponds to operating the power amplifier at an output power level below the peak power capability, usually done to accommodate a modulated signal with specified linearity requirements and a peak to average power ratio. However, typical RF power amplifiers with high linearity operating in a large back-off power domain exhibits low efficiencies.

For this reason, much effort has been put into increasing the efficiency of the RF power amplifier under back-off. In one approach, the Doherty power amplifier was introduced as a circuit that exhibits high efficiency at back-off. The Doherty amplifier achieves high efficiency at back-off through a main amplifier that operates into the high power added efficiency saturation region, and a peaking amplifier that supplies the signal peaks so that overall linearity can be restored. The Doherty configuration achieves load modulation by using the principle of "load pulling" using two devices. Thus in the Doherty power amplifier both the carrier and peaking amplifiers are connected in parallel across the load using a Doherty combiner.

A typical Doherty combiner comprises bulky, space-consuming distributed components, such as, micro-strip transmission lines or strip-line transmission lines, and is constructed on a low-loss substrate mounted on a large aluminum plate/block.

Alternatively, the Doherty combiner is also implemented as a surface mount component containing the space-consuming transmission lines. However, the presence of such bulky transmission lines impedes the integration of the power amplifier into small-sized and lower weight products; therefore, size issues associated with the Doherty amplifier design need to be addressed. The physical size of the transmission lines is proportional to the wavelength thus the physical size becomes particularly problematic as the frequency is decreased.

In addition, it is known that the cost of integrated circuits and modules (such as an RF amplifier) is usually proportional to the size of the integrated circuit die and/or the module; therefore, it is desirable to find techniques to reduce the increase in area because of the presence of the Doherty combiner. It is also highly desirable that the Doherty combiner circuit does not add any substantial cost or size to the integrated circuit (RF amplifier) containing the Doherty combiner circuits or to the development process, owing to re-designing, re-fabrication, and re-characterization of the different configurations (such as differing operating frequency, particularly low frequencies).

Therefore, it is desirable to find techniques that reduce the cost and size of the Doherty combiner and power amplifiers, and, at the same time, achieve better overall performance.

SUMMARY

According to the embodiments illustrated herein, there is provided a combiner coupled with the output terminals of a Doherty amplifier. The combiner includes an impedance inverter circuit and an impedance transformer circuit. The inverter circuit includes at least a first network and a second network. Each of the first and second networks includes lumped elements. The transformer circuit includes at least a third network and a fourth network. Each of the first, third and fourth networks includes the lumped elements. The lumped elements are selected from the group of capacitors and inductors.

The inverter circuit includes a first capacitor coupled in shunt between the output terminal of a main amplifier and a ground terminal. The inverter circuit further includes a second capacitor coupled in shunt between a first inductor and the ground terminal. The first inductor is connected to the first and second capacitors. The inverter circuit further includes a third capacitor coupled in shunt among the output terminals of one or more peaking amplifiers and the ground terminal. The second capacitor is coupled in shunt between a second inductor and the ground terminal, and the second inductor is connected to the second and third capacitors.

The lumped elements in the inverter circuit are arranged such that the impedance inverter circuit exhibits a first predefined impedance with a 90 degree phase shift.

The transformer circuit includes a fourth capacitor coupled in shunt between the output terminal of a main amplifier and a ground terminal. The transformer circuit further includes a fifth capacitor coupled in shunt between a third inductor and the ground terminal. The third inductor is connected to the fourth and fifth capacitors. The transformer circuit further includes a sixth capacitor coupled in shunt between the output terminals of one or more peaking amplifiers and the ground terminal. The fifth capacitor is coupled in shunt between a fourth inductor and the ground terminal, and the fourth inductor is connected to the fifth capacitor and the sixth capacitor.

BRIEF DESCRIPTION OF THE DRAWINGS

Various embodiments of the present disclosure will hereinafter be described in conjunction with the appended drawings provided to illustrate and not to limit the present disclosure, wherein like designations denote like elements, and in which.

DETAILED DESCRIPTION OF THE PREFERRED EMBODIMENTS

The invention can be best understood with reference to the detailed figures and description set forth herein. Various embodiments are discussed below with reference to the figures. However, those of ordinary skill in the art will readily appreciate that the detailed description given herein with respect to these figures is just for explanatory purposes. The disclosed systems extend beyond the described embodiments. For example, those of ordinary skill in the art will appreciate that in light of the teachings presented, multiple alternate and suitable approaches may be realized, to implement the functionality of any detail described herein, beyond the particular implementation choices in the following embodiments described and shown.

DEFINITIONS

The following terms shall have, for the purposes of this application, the respective meanings set forth below.

"Lumped elements" refers to a group of elements such as resistors, capacitors, and inductors.

"Distributed elements" refers to a group of elements such as transmission line or radial stub in which the attributes such as resistance, capacitance, and inductance is distributed continuously throughout the material of the element.

Typically, the distributed elements are bulkier and space consuming as compared to corresponding the lumped element. For example, a radial stub at low frequencies, when used as a capacitor, is much bulky and space consuming than a surface mount capacitor (i.e., lumped element).

Hereinafter, the terms "Combiner" and "Doherty combiner" may be used interchangeably.

Figure 1:
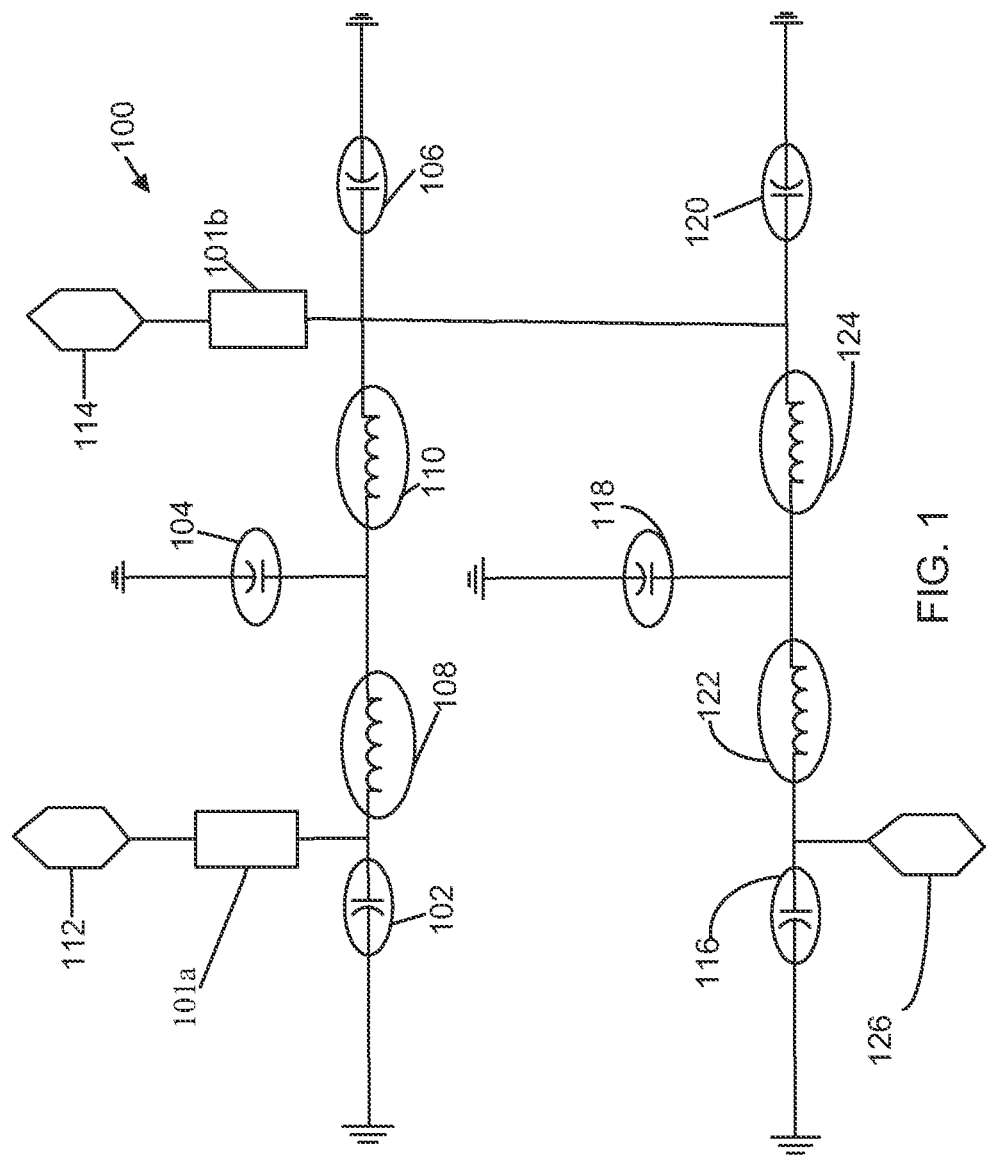
FIG. 1 is a schematic diagram illustrating a compact Doherty combiner coupled to output terminals of a Doherty amplifier in accordance with an embodiment of the invention.

FIG. 1 is a schematic diagram illustrating a compact Doherty combiner coupled to output terminals of a Doherty amplifier in accordance with an embodiment of the invention.

In an embodiment, the Doherty amplifier includes a main amplifier and one or more peaking amplifiers (not shown). The main amplifier of the Doherty amplifier amplifies input signals received. Each of the one or more peaking amplifiers of the Doherty amplifier represents another set of amplifiers for amplifying the input signals received.

The main amplifier includes a power transistor that can be sized smaller than a linear amplifier for the corresponding total output power level, and a power transistor for each of the one or more peaking amplifiers. The ratio of these respective transistor sizes determines an output power range over which optimum efficiency can be maintained. The higher this ratio, the wider the output power range over which optimum efficiency can be maintained. In another embodiment, it should be noted that each amplifier can include one or more transistors or other like circuit elements. Further, that the main amplifier and the peaking amplifier can be implemented in any known semiconductor technologies, such as Si LDMOS, GaN, HEMT, GaAs, MESFET, GaAs pHEMT, or GaAs HBT.

The peaking amplifier of the one or more peaking amplifiers is not operated, while low-level input signals are applied to the main amplifier. This is made possible by applying a bias control to the peaking amplifier, such that the peaking amplifier is biased, where little or no DC current flows. For example, Class C is a common bias condition for a GaN peaking amplifier. Over the low-output power range where the peaking amplifier is not substantially operated, the main amplifier has output impedance with a relatively constant and high value. As the peaking amplifier does not draw any current, the Doherty amplifier can obtain improved efficiency at an output power level lower than the highest output power level that the main amplifier can generate.

In an embodiment, a Doherty combiner 100 includes two phase offset transmission lines. The two phase offset transmission lines include a first phase offset transmission line 101a and a second phase offset transmission line 101b. First phase offset transmission line 101a and second phase offset transmission line 101b connect the output of the Doherty amplifier to the inputs of an impedance inverter.

Doherty combiner 100 combines the output power of the main amplifier and the peaking amplifier. Doherty combiner 100 includes an inverter circuit. The inverter circuit includes various lumped circuit elements, such as, a first capacitor 102, a second capacitor 104, a third capacitor 106, a first inductor 108, and a second inductor 110. First capacitor 102 is coupled in shunt between first phase offset transmission line 101a and a ground terminal. First phase offset transmission line 101a is connected in series with an output terminal 112 of the main amplifier. Second capacitor 104 is coupled in shunt between first inductor 108 and ground terminal. First inductor 108 is connected to first capacitor 102 and second capacitor 104. Third capacitor 106 is coupled in shunt between second phase offset transmission line 101b and ground terminal. Second phase offset transmission line 101b is connected in series with an output terminal 114 of the peaking amplifier. Second capacitor 104 is coupled in shunt between second inductor 110 and ground terminal. Second inductor 110 is connected between second capacitor 104 and third capacitor 106.

In an embodiment, first capacitor 102, second capacitor 104, third capacitor 106, first inductor 108, and second inductor 110 are arranged such that the inverter circuit exhibits a first predefined impedance with a 90 degree phase shift.

Doherty combiner 100 further includes a transformer circuit. The transformer circuit includes various lumped circuit elements, such as, a fourth capacitor 116, a fifth capacitor 118, a sixth capacitor 120, a third inductor 122, and a fourth inductor 124. Fourth capacitor 116 is coupled in shunt between an output terminal 126 of the main amplifier and a ground terminal. Fifth capacitor 118 is coupled in shunt between third inductor 122 and ground terminal. Third inductor 122 is connected in series to fourth capacitor 116 and fifth capacitor 118. Sixth capacitor 120 is coupled in shunt between second phase offset transmission line 101b and the ground terminal. Fifth capacitor 118 is coupled in shunt between fourth inductor 124 and ground terminal. Fourth inductor 124 is connected in series to fifth capacitor 118 and sixth capacitor 120.

In an embodiment, fourth capacitor 116, fifth capacitor 118, sixth capacitor 120, third inductor 122, and fourth inductor 124 are arranged such that the transformer circuit exhibits a second predefined impedance and phase shift.

A person having ordinary skill in the art will understand that single peaking amplifier has been shown for illustrative purposes. Doherty combiner 100 may also be modified to combine the output power of the main amplifier and one or more peaking amplifiers. In such case, Doherty amplifier will include a plurality of peaking amplifiers connected in parallel with main amplifier, and the combiner will include a plurality of phase offset transmission lines, wherein each of the phase offset transmission lines is connected between the output terminals of corresponding peaking amplifier of the plurality of the peaking amplifiers and the transformer circuit. Various such Doherty amplifier configurations having combiners for combining signals from more than one peaking amplifiers have been disclosed in the U.S. patent application Ser. No. 13/548,774, filed Jul. 10, 2012 entitled "INTEGRATED OUTPUT COMBINER FOR AMPLIFIER SYSTEM", by the same inventor and assigned to the same assignee (ANADIGICS, INC.), which is herein incorporated by reference in its entirety.

In an embodiment, the selection of the type, the material, and the construction of each of the capacitors and inductors is done so as to achieve the high-power handling requirements and the low loss in Doherty combiner 100. In an embodiment, each of first capacitor 102, second capacitor 104, third capacitor 106, fourth capacitor 116, fifth capacitor 118, and sixth capacitor 120 is a radial stub. The radial stub is used when the implementations of combiner 100 for the Doherty amplifier are required at very high frequencies. Each of first capacitor 102, second capacitor 104, third capacitor 106, fourth capacitor 116, fifth capacitor 118, and the sixth capacitor 120 is a low-loss high-Q surface mount capacitor. Each of first, second, third, and fourth inductors (108, 110, 122, and 124) is a low-loss substrate-less film inductor. In certain high-power requirement implementations of combiner 100 for the Doherty amplifier, each of first, second, third, and fourth inductors (108, 110, 122, and 124) is a wire-wound inductor. In certain high-frequency requirement implementations of combiner 100 for the Doherty amplifier, each of first, second, third, and fourth inductors (108, 110, 122, and 124) is replaced with a printed trace, such as a low cost spiral copper trace printed on the laminate.

In an embodiment, the value for each component in a combiner for the Doherty amplifier is determined by a mathematical optimization technique such as the minimization of S21 (insertion losses). The technique involves the recombination of the two split signals created by the input source being split by a mathematical representation of a power splitter. These techniques compensate/cancel/tune out the effects of a non-ideal splitter behavior, such as a non-ideal 90 degree phase split in practical 90 degree hybrid splitters.

Phase offset transmission lines (101a and 101b) facilitate in the improvement of the combiner by improving the presented off-state impedance of the peaking amplifier and to optimize the AM/AM and AM/PM distortion of the combined Doherty amplifier. In another embodiment the phase offset transmission lines are replaced with phase-shifting networks such as compact C-L-C π (Pi) networks. In another embodiment, the combiner for the Doherty amplifier includes a plurality of phase-shifting networks to improve the presented off-state impedance of the plurality of peaking amplifiers and to optimize the AM/AM and AM/PM distortion of the combined Doherty amplifier.

AM/AM distortion refers to undesired amplitude deviations in the output while amplifying the peaks of the communication signal. Similarly, AM/PM distortion refers to undesired phase deviations in the output while amplifying the peaks of the communication signal. As most of the analog communication signals carry digital symbols, AM/AM distortion and AM/PM distortion may impede the ability to recognize the digital symbols leading to a distortion known as Error Vector Magnitude (EVM).

A person having ordinary skill in the art will understand that AM/AM distortions and AM/PM distortions in the output signal can be introduced due to various other factors such as the non-linear characteristics of amplifiers in the Doherty amplifier, and sudden gain compression and expansion in the amplifiers.

The presence of lumped elements such as first capacitor 102, second capacitor 104, third capacitor 106, fourth capacitor 116, fifth capacitor 118, sixth capacitor 120, first inductor 108, second inductor 110, third inductor 122, and fourth inductor 124 in the circuit of Doherty combiner 100 reduces the cost and size of Doherty combiner 100 in comparison to the typical Doherty combiner which includes bulky, space-consuming transmission lines and/or radial stubs. Thus, due to the presence of above described lumped elements in circuit of Doherty combiner 100, the integration of Doherty combiner 100 of compact size into small cell infrastructure and mobile produces becomes easier and, at the same time, achieve better overall performance.

Figure 2:
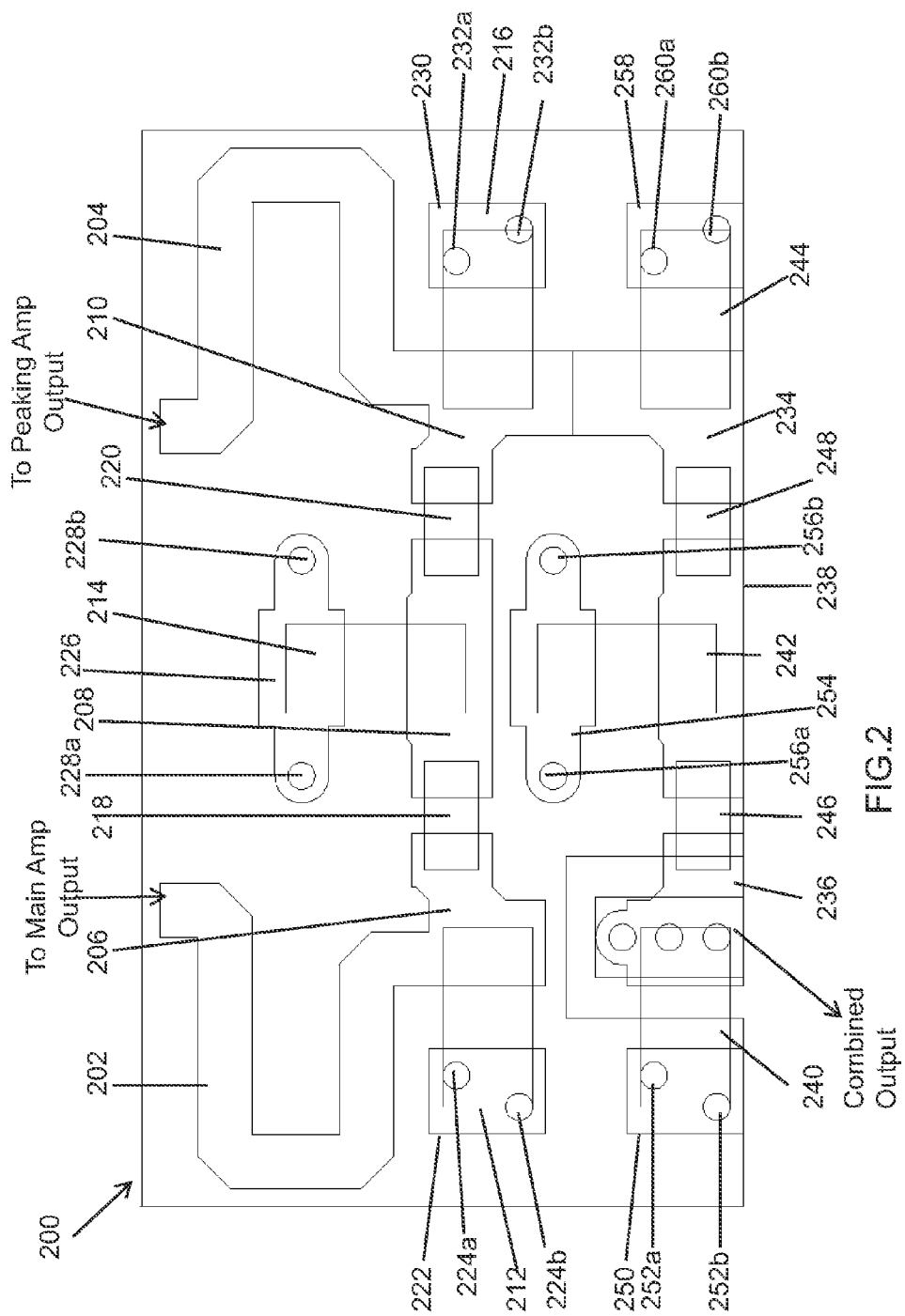
FIG. 2 depict the layout of a compact Doherty combiner in accordance with various embodiments of the invention.

FIG. 2 depict layout of a compact Doherty combiner in accordance with various embodiments of the invention.

Doherty combiner 200 includes two phase offset transmission lines. The two phase offset transmission lines include a first phase offset transmission line 202 (corresponding to first phase offset transmission line 101a) and a second phase offset transmission line 204 (corresponding to second phase offset transmission line 101b). First phase offset transmission line 202 and second phase offset transmission line 204 connect the output of the Doherty amplifier to the inputs of an impedance inverter. First phase offset transmission line 202 and second phase offset transmission line 204 are useful primarily due to two reasons. Firstly it improves the presented off-state impedance of the peaking amplifier, and secondly they can be adjusted to optimize the AM/AM and AM/PM distortion of the combined Doherty amplifier.

In some implementations both first phase offset transmission line 202 and second phase offset transmission line 204 have the same electrical length. In other implementations first phase offset transmission line 202 and second phase offset transmission line 204 may be adjusted to different electrical lengths in order to achieve the desired load modulation at the main amplifier and to optimize AM/AM and AM/PM distortions.

In an embodiment, Doherty combiner 200 is fabricated on a laminate substrate. The laminate substrate includes a dielectric layer. The laminate substrate further includes a top and bottom copper layer. In another embodiment, Doherty combiner 200 is fabricated on a ceramic substrate, wherein the ceramic substrate includes a conducting material such as silver or copper. It will be apparent to a person with ordinary skill in the art that any suitable conducting material can be used for the substrate on which Doherty combiner 200 is fabricated.

Doherty combiner 200 further includes an inverter circuit and a transformer circuit. The inverter circuit of Doherty combiner 200 includes a first network and a second network. Each of the first and second networks includes lumped elements. The transformer circuit of Doherty combiner 200 includes a third network and a fourth network. Each of the third and fourth networks includes lumped elements. The lumped elements are selected from the group of capacitors and inductors. In the embodiment illustrated in FIG. 1, the four lumped networks are of the C-L-C π type.

In an embodiment, the inverter circuit includes a first top metal pattern 206, a second top metal pattern 208, and a third top metal pattern 210. First top metal pattern 206 is a microstrip line and comprises first phase offset transmission line 202. First phase offset transmission line 202 is the input of the inverter circuit and is connected to the output terminal of the main amplifier. Third top metal pattern 210 is a microstrip line and comprises second phase offset transmission 204. Second phase offset transmission line 204 is the output of the impedance inverter circuit and is connected to the output terminal of the peaking amplifier. The inverter circuit further includes a first capacitor 212, a second capacitor 214, a third capacitor 216, a first inductor 218, and a second inductor 220.

In an embodiment, first capacitor 212 is coupled in shunt to a ground terminal through a first top metal pad 222, and a first pair of laminate vias 224a and 224b. Second capacitor 214 is coupled in shunt to the ground terminal through a second top metal pad 226, and a second pair of laminate vias 228a and 228b. Third capacitor 216 is coupled in shunt to the ground terminal through a third top metal pad 230, and a third pair of laminate vias 232a and 232b. First inductor 218 is connected in series to first capacitor 212 through first top metal pattern 206. First inductor 218 is also connected in series to second capacitor 214 through second top metal pattern 208. Second inductor 220 is connected in series to second capacitor 214 through second top metal pattern 208. Second inductor 220 is also connected in series to third capacitor 216 through third top metal pattern 210.

The term "via" is referred to as Vertical Interconnect Access, and is a vertical electrical connection between different layers of conductors in a physical electronic circuit. In the embodiment, the "via" is a copper plated drilled hole that allows a conductive connection between different layers.

The inverter circuit is connected to the transformer circuit. The third top metal pattern 210 of the inverter circuit connects to a fourth top metal pattern 234 of the transformer circuit. The transformer circuit includes a fourth top metal pattern 234, a fifth top metal pattern 236, and a sixth top metal pattern 238. The output of the main amplifier is connected to first phase offset transmission line 202. The output of the peaking amplifier is connected to second phase offset transmission line 204. The transformer circuit further includes a fourth capacitor 240, a fifth capacitor 242, a sixth capacitor 244, a third inductor 246, and a fourth inductor 248.

Fourth capacitor 240 is coupled in shunt to a ground terminal through a fourth top metal pad 250, and a fourth pair of laminate vias 252a and 252b. Fifth capacitor 242 is coupled in shunt to the ground terminal through a fifth top metal pad 254, and a fifth pair of laminate vias 256a and 256b. Sixth capacitor 244 is coupled in shunt to the ground terminal through a sixth top metal pad 258, and a sixth pair of laminate vias 260a and 260b. Third inductor 246 is connected in series to fourth capacitor 240 through fifth top metal pattern 236. Fourth inductor 248 is also connected in series to fifth capacitor 242 through sixth top metal pattern 238. Fourth inductor 248 is also connected in series to sixth capacitor 244 through fourth top metal pattern 234.

As discussed above, the inverter circuit of Doherty combiner 200, comprised of lumped elements, is designed to match the S-parameter matrix of an ideal phase inverter comprised of bulky transmission lines. The transformer circuit of Doherty combiner 200, comprised of lumped elements, is designed to match the S-parameter matrix of an ideal quarter wave transmission line transformer. The presence of lumped elements in the inverter circuit and the transformer circuit of Doherty combiner 200 enables Doherty combiner 200 to be fabricated in a very compact size, thus it enables reduced cost, reduced size, and reduced losses. Doherty combiner 200 can be implemented for a variety of different frequencies by simply changing the values (part numbers) of the surface mount capacitors and inductors greatly reducing the cost and time of re-design and re-fabrication. Doherty combiner 200 can also reduce losses through adjustment (optimization) of the basic lumped network designs to compensate for Doherty input power splitter phase and amplitude imbalances. The lumped elements may be selected on the basis of their size and the required voltage and loss characteristics.

While various embodiments of the present invention have been illustrated and described, it will be clear that the present invention is not limited to these embodiments. Numerous modifications, changes, variations, substitutions, and equivalents will be apparent to those skilled in the art, without departing from the spirit and scope of the invention, as described in the claims that follow.

What is claimed is:

1. A combiner for connection to the output terminals of a Doherty amplifier having a main amplifier and one or more peaking amplifiers, the combiner comprising:
   an inverter circuit comprising at least a first network and a second network, wherein each of the first network and the second network includes lumped elements, and
   a transformer circuit comprising at least a third network and a fourth network, wherein each of the third network and the fourth network includes the lumped elements, wherein the lumped elements are selected from a group of capacitors and inductors,
   wherein the first network includes:
      a first capacitor coupled in shunt between an output terminal of the main amplifier and a ground terminal;
      a second capacitor coupled in shunt between a first inductor and the ground terminal; and
      the first inductor connected to the first capacitor and the second capacitor; and
   wherein the second network includes:
      a third capacitor coupled in shunt between output terminals of the one or more peaking amplifiers and the ground terminal;
      the second capacitor coupled in shunt between a second inductor and the ground terminal; and
      the second inductor connected to the second capacitor and the third capacitor.

2. The combiner of claim 1, further comprising:
   a first phase offset transmission line connected in series with the output terminal of the main amplifier and coupled to the first network, and
   a second phase offset transmission line connected in series with one of the output terminals of the one or more peaking amplifiers and coupled to the second network,
   wherein each of the first phase offset transmission line and the second phase offset transmission line reduces amplitude deviations and/or phase deviations and improves AM/AM distortion and AM/PM distortion in an output communication signal of the combiner.

3. The combiner of claim 2, wherein
   the AM/AM distortion comprises amplitude deviations in the output communication signal while amplifying peaks of the output communication signal and
   the AM/PM distortion comprises phase deviations in the output communication signal while amplifying the peaks of the output communication signal.

4. The combiner of claim 2, wherein
   the first phase offset transmission line and the second phase offset transmission line improve off-state impedance of the one or more peaking amplifiers.

5. The combiner of claim 1, wherein the third network includes:
   a fourth capacitor coupled in shunt between the output terminal of the main amplifier and the ground terminal;
   a fifth capacitor coupled in shunt between a third inductor and the ground terminal; and
   the third inductor connected to the fourth capacitor and the fifth capacitor.

6. The combiner of claim 1, wherein the fourth network includes:
   a sixth capacitor coupled in shunt between the output terminals of the one or more peaking amplifiers and the ground terminal;
   a fifth capacitor coupled in shunt between a fourth inductor and the ground terminal; and
   the fourth inductor connected to the fifth capacitor and the sixth capacitor.

7. The combiner of claim 1, wherein one or more radial stubs are used as the capacitors in the first network, the second network, the third network, or the fourth network.

8. The combiner of claim 1, wherein each of the capacitors in the first network, the second network, the third network, or the fourth network is a low-loss high-Q surface mount capacitor.

9. The combiner of claim 1, wherein the combiner is fabricated on a laminate substrate, and wherein the laminate substrate includes a dielectric layer.

10. The combiner of claim 1, wherein the combiner is fabricated on a laminate substrate, and wherein the laminate substrate includes conducting material such as silver.

11. The combiner of claim 1 further comprises a plurality of phase offset transmission lines; wherein the plurality of phase offset transmission lines provide minimum AM/AM distortion and minimum AM/PM distortion.

12. The combiner of claim 1, further comprising
one or more phase shifting networks, wherein the one or more phase shifting networks comprise compact C-L-C Pi networks.

13. The combiner of claim 12, wherein
the one or more phase shifting networks improve off-state impedance of the one or more peaking amplifiers and reduce amplitude deviations and/or phase deviations and improves AM/AM distortion and AM/PM distortion in an output communication signal of the combiner.

14. A Doherty combiner, wherein the Doherty combiner is connectable to output terminals of a Doherty amplifier comprising a main amplifier and one or more peaking amplifiers, the Doherty combiner comprising:
an inverter circuit comprising:
a first capacitor coupled in shunt between the output terminal of the main amplifier and a ground terminal,
a second capacitor coupled in shunt between a first inductor and the ground terminal,
the first inductor connected to the first capacitor and the second capacitor,
a third capacitor coupled in shunt between the output terminals of the one or more peaking amplifiers and the ground terminal,
and wherein the second capacitor is coupled in shunt between a second inductor and the ground terminal, and
the second inductor connected to the second capacitor and the third capacitor; and
a transformer circuit comprising:
a fourth capacitor coupled in shunt between the output terminal of the main amplifier and a ground terminal,
a fifth capacitor coupled in shunt between a third inductor and the ground terminal,
the third inductor connected to the fourth capacitor and the fifth capacitor,
a sixth capacitor coupled in shunt between the output terminals of the one or more peaking amplifiers and a ground terminal,
the fifth capacitor coupled in shunt between a fourth inductor and the ground terminal, and
the fourth inductor connected to the fifth capacitor and the sixth capacitor.

15. A Doherty combiner, wherein the Doherty combiner is connectable to output terminals of a Doherty amplifier comprising a main amplifier and one or more peaking amplifiers, the Doherty combiner comprising:
an impedance inverter circuit receiving a signal from the main amplifier, the impedance inverter circuit comprising first lumped elements, wherein the first lumped elements are arranged such that the impedance inverter circuit exhibits a first predefined impedance with ninety degree phase shift; and
a impedance transformer circuit receiving the signal from the main amplifier, wherein the impedance transformer circuit includes second lumped elements, the second lumped elements are arranged such that the impedance transformer circuit exhibits a second predefined impedance, and the first and second lumped elements are selected from a group of capacitors and inductors.

16. The Doherty combiner of claim 15, wherein the first lumped elements include:
a first capacitor coupled in shunt between an output terminal of the main amplifier and a ground terminal;
a second capacitor coupled in shunt between a first inductor and the ground terminal;
the first inductor coupled to the first capacitor and the second capacitor;
a third capacitor coupled in shunt between output terminals of the one or more peaking amplifiers and the ground terminal;
the second capacitor coupled in shunt between a second inductor and the ground terminal; and
the second inductor connected to the second capacitor and the third capacitor.

17. The Doherty combiner of claim 15, wherein the second lumped elements include:
a fourth capacitor coupled in shunt between an output terminal of the main amplifier and a ground terminal;
a fifth capacitor coupled in shunt between a third inductor and the ground terminal;
the third inductor connected to the fourth capacitor and the fifth capacitor;
a sixth capacitor coupled in shunt between output terminals of the one or more peaking amplifiers and the ground terminal;
the fifth capacitor coupled in shunt between a fourth inductor and the ground terminal; and
the fourth inductor connected to the fifth capacitor and the sixth capacitor.

* * * * *